(12) United States Patent
Kitamura

(10) Patent No.: US 6,281,495 B1
(45) Date of Patent: Aug. 28, 2001

(54) METHOD OF PRODUCING MAGNETIC FORCE IMAGE AND SCANNING PROBE MICROSCOPE

(75) Inventor: Shinichi Kitamura, Saitama (JP)

(73) Assignee: Jeol Ltd., Tokyo (JP)

( * ) Notice: Subject to any disclaimer, the term of this patent is extended or adjusted under 35 U.S.C. 154(b) by 0 days.

(21) Appl. No.: 09/198,992

(22) Filed: Nov. 23, 1998

(30) Foreign Application Priority Data

Nov. 25, 1997 (JP) .................................................. 9-323199

(51) Int. Cl.[7] .................................................... H01J 48/40
(52) U.S. Cl. ............................ 250/306; 250/307; 73/105
(58) Field of Search ................................ 250/306, 307; 73/105

(56) References Cited

U.S. PATENT DOCUMENTS 5,308,974   5/1994   Elings et al. ........................ 250/234
5,519,212 * 5/1996   Elings et al. ........................ 250/306

OTHER PUBLICATIONS

"Separation of magnetic and topographic effects in force microscopy", *J. Appl. Phys.*, vol. 67. No. 12, Jun. 15, 1990, pp. 7278–7280.

* cited by examiner

*Primary Examiner*—Kiet T. Nguyen
(74) *Attorney, Agent, or Firm*—Webb Ziesenheim Logsdon Orkin & Hanson, P.C.

(57) ABSTRACT

There is disclosed a scanning probe microscope for producing a topographic image of a surface of a sample by noncontact AFM (atomic force microscopy). First, a first topographic image of the sample undergoing magnetic effects is produced from the resonance frequency of a cantilever by FM detection. Then, a second topographic image of the sample free of magnetic effects is produced from the amplitude of the cantilever by slope detection. The difference between these two topographic images is taken. Thus, a magnetic force image is produced.

5 Claims, 3 Drawing Sheets

METHOD OF PRODUCING MAGNETIC FORCE IMAGE AND SCANNING PROBE MICROSCOPE

FIELD OF THE INVENTION

The present invention relates to scanning probe microscopy (SPM) techniques using a noncontact atomic force microscope (AFM) which receives forces from a sample and produces a topographic image of the surface of the sample and which is also capable of detecting magnetic forces from the sample by magnetic force microscopy (MFM) utilizing the functions of the noncontact AFM.

DESCRIPTION OF THE PRIOR ART

Scanning probe microscopy has been heretofore developed which images the topography of the surface of a sample by the function of noncontact AFM by measuring a physical force produced between a tip and the sample and which can also detect the magnetic force from the sample by the functions of MFM. In this conventional SPM, the magnetic force is a long-range force and so the magnetic force is separated from the atomic force by moving the tip or cantilever away from the sample into a position where the atomic force no longer affects the tip or cantilever; in the topography mode, the atomic force dominates. This method of detection is generally known as lift mode operation. The tip is lifted for every point, every line, or every frame of image on the scanned sample surface. Thus, a topographic image and an atomic force image are both obtained.

In this lift mode operation, the topographic image and atomic force image seem to be separated completely. In practice, however, the spatial resolution is deteriorated because the distance between the sample and the tip is increased. Consequently, only large force variations, i.e., magnetic force variations, are imaged. Therefore, it seems as if the magnetic force image were completely separated from the topographic image. Accordingly, in this lift mode operation, it is difficult to improve the resolution of the magnetic force image further.

SUMMARY OF THE INVENTION

In view of the foregoing circumstances, the present invention has been made.

It is an object of the present invention to provide a scanning probe microscope (SPM) capable of providing a magnetic force image of a sample with improved resolution easily and reliably.

One embodiment of the present invention starts with obtaining a first kind of topographic data of a sample from the resonance frequency of a cantilever in noncontact mode by FM detection. This first kind of topographic data undergoes magnetic effects. A second kind of topographic data of the sample free of magnetic effects is derived from the amplitude of the cantilever by slope detection. The difference between these two kinds of topographic data is produced, thus giving rise to data about a magnetic force image.

Another embodiment of the invention starts with obtaining a first kind of topographic data of a sample from the resonance frequency of a cantilever in noncontact mode by FM detection. The topographic data undergoes magnetic effects. A second kind of topographic data of the sample free of magnetic effects is derived from the resonance frequency of the cantilever in contact mode by FM detection. The difference between these two kinds of topographic data is produced, thus giving rise to data about a magnetic force image.

A further embodiment of the invention provides a scanning probe microscope that images the surface of a sample by FM detection and images the surface by slope detection or contact-mode operation. In particular, an error amplifier produces a first output when the difference between the output from a frequency-to-voltage converter and a first reference voltage applied to the error amplifier is kept constant. A topographic image of the sample is obtained from the first output by FM detection. This topographic image undergoes magnetic effects of the sample. The error amplifier produces a second output when the difference between the output from an amplitude-to-voltage converter and a second reference voltage applied to the error amplifier is kept constant. Another topographic image is obtained from the second output by slope detection or contact-mode operation. This topographic image undergoes no magnetic effects of the sample. An arithmetic means calculates the difference between these two topographic images. As a result, the difference reflects only the magnetic effects. Hence, a high-resolution magnetic force image of the sample is derived from this difference.

Still other embodiments of the invention provide a scanning probe microscope that images the surface of a sample only by FM detection. Where the surface of the sample is imaged while a tip is not in contact with the sample, an error amplifier produces a first reference voltage when the difference between the output from a frequency-to-voltage converter and a first reference voltage applied to the error amplifier is kept constant. A topographic image of the sample surface is obtained from the first output from the error amplifier. This topographic image undergoes magnetic effects from the sample. Where the sample surface is imaged when the tip is closest to and contacts the sample, the error amplifier produces a second output provided that the difference between the output from the frequency-to-voltage converter and a second reference voltage applied to the error amplifier is kept constant. A topographic image of the sample surface is derived from the second output from the error amplifier. This topographic image undergoes no magnetic effects of the sample. In the same way as the embodiment described first, the difference between these two images is calculated. Consequently, a high-resolution magnetic force image of the sample can be obtained.

In one embodiment of the invention, plural reference voltages are established. In consequence, magnetic force images can be produced with higher resolution.

Other objects and features of the invention will appear in the course of the description thereof, which follows.

PREFERRED EMBODIMENTS OF THE INVENTION

Figure 1:
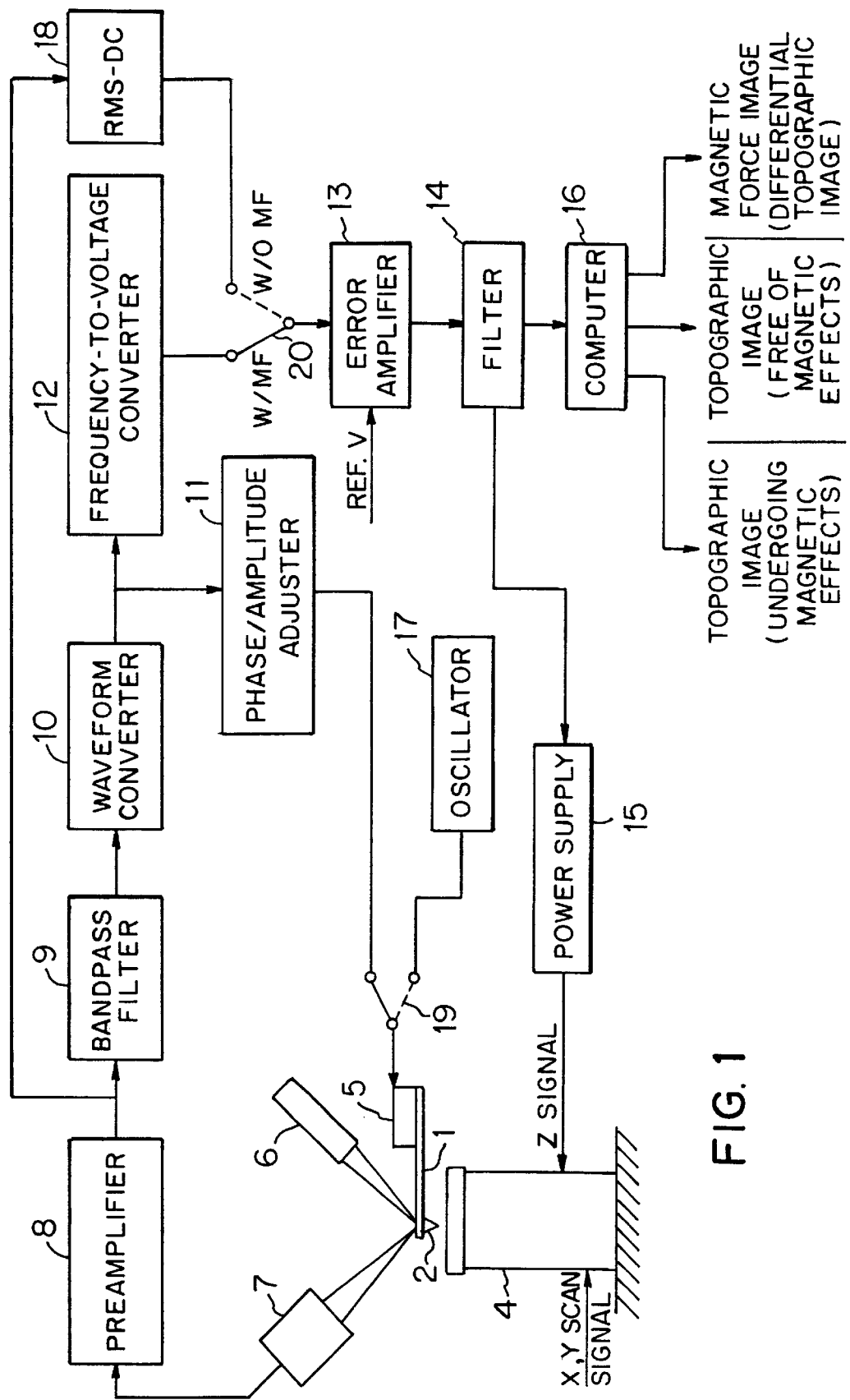
FIG. 1 is a schematic block diagram of a scanning probe microscope in accordance with the present invention.

Referring to FIG. 1, there is shown a scanning probe microscope embodying the concept of the present invention. This scanning probe microscope (SPM) is fitted with a cantilever having a resonance frequency. This microscope produces a first topographic image of a surface of a sample from the resonance frequency of the cantilever by FM detection. This first topographic image feels magnetic effects. The microscope also produces a second topographic image from the amplitude of the cantilever by slope detection. This second image receives no magnetic effects. The difference between these two topographic images is found to produce a magnetic force image of the sample.

In recent years, a cantilever having a relatively large spring constant has been used in ultrahigh vacuum, thus permitting imaging of atoms by noncontact AFM. The surface of the sample having magnetic forces is imaged by FM detection. Thus, a high-resolution topographic image undergoing magnetic effects is produced. Slope detection permits imaging with relatively high resolution at large amplitudes. The sample surface having magnetic forces is imaged by this slop detection. As a result, a topographic image free of magnetic effects is obtained.

The scanning probe microscope shown in FIG. 1 has a resilient cantilever 1, a magnetized tip 2 mounted at the front end of the cantilever 1, and a piezoelectric scanner 4 for holding a sample 3 and controlling its position in the direction of the x-axis (in the horizontal direction as viewed in FIG. 1), in the direction of the y-axis (perpendicularly to the plane of sheet) and in the direction of the z-axis (in the vertical direction as viewed in FIG. 1). The magnetized tip 2 is coated with a ferromagnetic substance such as cobalt or nickel. A piezoelectric element 5 is mounted at the rear end of the cantilever 1 to apply vibrations. A light source 6 (such as a laser) directs focused light to the rear surface of the cantilever 1. An optical detector 7 such as a 2-segmented photodiode detects light reflected from the rear surface of the cantilever 1 and converts it into an electrical signal. The output electrical signal from the optical detector 7 is amplified to appropriate amplitude by a preamplifier 8.

A bandpass filter 9 is set near the resonance frequency of the cantilever 1, passes a band of frequencies including the resonance frequency, and rejects other frequencies, thereby eliminating noises as much as possible. A waveform converter 10 consisting of a comparator, for example, acts to convert incoming waveform into a square wave having a given width such as a power-supply voltage and to create a reference voltage. A phase/amplitude adjuster 11 adjusts the phase of the reference wave from the waveform converter 10 to maximize the positive feedback provided by an oscillation system (described later). The adjuster 11 has dividing resistors to set the amplitude of the oscillating cantilever 1 to an appropriate level. This voltage is applied to the piezoelectric element 5 for oscillation. A frequency-to-voltage converter 12 consists of a PLL and converts frequency variations into corresponding voltages with reference to the output from the waveform converter 10, or the reference wave. An error amplifier 13 produces a constant voltage according to the output from the frequency-to-voltage converter 12 and the reference voltage V set for FM detection. This maintains the deviation from the resonance frequency constant. Also, the error amplifier 13 produces a constant voltage according to the output from an RMS-DC (amplitude-to-dc voltage converter) 18 and a reference voltage V set for slope detection. This keeps attenuated amplitude constant.

A filter 14 is connected with the output of the error amplifier 13 to stabilize the operation of a feedback circuit for controlling the distance between the tip 2 and the sample 3. A z piezoelectric element drive power supply 15 feeds the output from the filter 14 back to the piezoelectric scanner 4 to control the distance between the tip 2 and the sample 3. A computer 16 displays a topographic image undergoing magnetic effects, a topographic image free of magnetic effects and a differential topographic image produced by taking the difference between the two images on a display unit (not shown) according to the output from the filter 14. An oscillator 17 applies an oscillating voltage to the piezoelectric element 5 to oscillate or resonate the cantilever 1 at or near its resonance frequency. The aforementioned amplitude-to-dc voltage converter 18 converts the output from the preamplifier 8 into a dc voltage corresponding to the amplitude. A first switch 19 applies one of the oscillating voltage from the phase/amplitude adjuster 11 and the oscillating voltage from the oscillator 17 to the piezoelectric element 5. A second switch 20 supplies one of the output from the frequency-to-voltage converter 12 and the output from the amplitude-to-dc voltage converter 18 to the error amplifier 13.

The scanning probe microscope constructed in this way adopts a detection system that uses an optical lever to detect deflections of the cantilever 1. In this detection system, the tip 2 is placed opposite to the sample 3 and is not in contact with the sample 3. Light emitted by the light source 6 such as a laser is focused onto the rear surface of the cantilever 1. The light is reflected off the rear surface. At this time, atomic force between the tip 2 and the sample 3 deflects the cantilever 1, causing a change in the reflection angle. This produces a change in the illuminated position on the optical detector 7 that is spaced from the cantilever 1. The amount of deflection of the cantilever 1 is determined from the change in the illuminated position.

The piezoelectric element 5 for applying vibrations, the optical detector 7, the preamplifier 8, the bandpass filter 9, the waveform converter 10 and the phase/amplitude adjuster 11 form the oscillation system that oscillates the cantilever 1 at its resonance frequency in FM detection. The gain of the preamplifier 8 is so set that the reference wave from the waveform converter 10 does not respond to unexpected variations in the amplitude of the cantilever 1. The phase/amplitude adjuster 11 adjusts the phase so that the oscillation system provides maximum positive feedback. This oscillation system oscillates the cantilever 1 at or near its resonance frequency while maintaining the amplitude of the oscillating cantilever constant.

The oscillator 17 constitutes an oscillation system utilizing slope detection. This oscillator 17 oscillates the cantilever 1 at or near its resonance frequency while holding the amplitude of the cantilever constant.

The piezoelectric element 5 for applying vibrations, the optical detector 7, the preamplifier 8, the bandpass filter 9, the waveform converter 10, the frequency-to-voltage converter 12, the error amplifier 13, the filter 14 and the z piezoelectric element drive power supply 15 together form a feedback control system exploiting FM detection. The piezoelectric element 5 for applying vibrations, the optical detector 7, the preamplifier 8, the RMS-DC (amplitude-to-dc voltage converter) 18, the error amplifier 13, the filter 14 and the z piezoelectric element drive power supply 15 form a feedback control system making use of slope detection. These feedback control systems provide feedback control of the piezoelectric scanner 4 to maintain constant the distance between the tip 2 and the sample 3 or to maintain the attenuated amplitude constant.

The output from the filter 14 gives a topographic signal of the surface of the sample 3. This topographic signal is sent to the display unit (not shown) via the computer 16. The tip 2 or the sample 3 is scanned in two dimensions, i.e., in the x- and y-directions, while maintaining the tip-sample spacing constant. In this manner, a topographic image of the surface of the sample 3 is displayed on the display unit.

Where a topographic image undergoing magnetic effects is created by FM detection, the first and second switches 19 and 20, respectively, are set as indicated by the solid lines. At the same time, the reference voltage V applied to the error amplifier 13 is adjusted to a value adapted for FM detection. Under this condition, the oscillating voltage from the phase/amplitude adjuster 11 is applied to the piezoelectric element 5. The output from the frequency-to-voltage converter 12 is supplied to the error amplifier 13.

The light from the light source 6 is directed to the rear surface of the cantilever 1. The reflected light is detected by the optical detector 7. The aforementioned oscillation system oscillates the cantilever 1 at its resonance frequency. The above-described feedback control is provided to maintain the tip-sample separation constant. At the same time, the piezoelectric scanner 4 scans the sample 3 in two dimensions, i.e., in the x- and y-directions. The output from the filter 14 is a topographic signal undergoing magnetic effects. This topographic signal is stored in the computer 16 and displayed on the display unit (not shown). Hence, a topographic image having magnetic-force components of the sample 3 is obtained.

Where a topographic image free of magnetic effects is produced by slope detection, the first and second switches 19 and 20, respectively, are switched to the positions indicated by the dotted lines. The oscillating voltage from the oscillator 17 is applied to the piezoelectric element 5. The output from the RMS-DC (amplitude-to-dc voltage converter) 18 is sent to the error amplifier 13. Concurrently, the reference voltage V applied to the error amplifier 13 is switched to a value adapted for slope detection.

The light from the light source 6 is made to impinge on the rear surface of the cantilever 1 while oscillating or resonating the cantilever 1 at or near its resonance frequency by the oscillator 17. The reflected light is detected by the optical detector 7. The optical detector 7 converts the amplitude of the cantilever represented by the reflected light into an electrical signal. The output signal from this optical detector 7 is sent via the preamplifier to the RMS-DC (amplitude-to-dc voltage converter) 18, which converts the amplitude into a dc voltage. This dc voltage is applied to the error amplifier 13. Since the amplitude of the oscillating cantilever 1 is damped out to some extent by the force gradient produced between the tip 2 and the sample 3, the dc voltage from the amplitude-to-dc voltage converter 18 is also attenuated.

The error amplifier 13 maintains constant the difference between the output from the amplitude-to-dc voltage converter 18 and the given voltage set by the reference voltage V. That is, the attenuated amplitude is kept constant. This output from the error amplifier 13 is fed back to the z piezoelectric element drive power supply 15 via the filter 14 in the same way as in the case of FM detection described above. At this time, the amount of attenuation of the amplitude is determined by the reference voltage V applied to the error amplifier 13. The z piezoelectric element drive power supply 15 provides feedback control of the piezoelectric scanner 4 according to the feedback control signal. At the same time, the piezoelectric scanner 4 scans the sample 3 in two dimensions, i.e., in the x- and y-directions. The output from the filter 14 is a topographic signal free of magnetic effects. This topographic image is stored in the computer 16 and displayed on the display unit (not shown). In this way, a pure topographic image free of magnetic effects is obtained. The magnetic effects can be almost fully eliminated by increasing the amplitude of the oscillating cantilever 1 and increasing the attenuation coefficient during the imaging.

During collection of image information, the computer 16 calculates the difference between these two topographic images obtained by FM detection and slope detection, respectively, for every point, every line, or every frame of image of the sample 3. The resulting differential image is a magnetic force image and displayed on the display unit (not shown). In this way, a magnetic force image of the sample 3 is derived.

Instead of the aforementioned optical lever, other method such as optical interference or electrostatic capacity method may be used to detect deflections of the cantilever 1. Instead of the slope detection described above, a contact-mode operation may be employed in which the oscillation is stopped and the output from the preamplifier 8 is directly applied to the error amplifier 13.

When the tip 2 is brought closest to the sample 3 by setting of the reference voltages during oscillation and FM detection is used, the tip-sample spacing can be so reduced that they touch each other. However, in the embodiment shown in FIG. 1, there is a danger that the amplitude of the oscillating cantilever 1 will be reduced rapidly, making the oscillation unstable. Therefore, the tip-sample separation cannot be made quite small.

Figure 2:
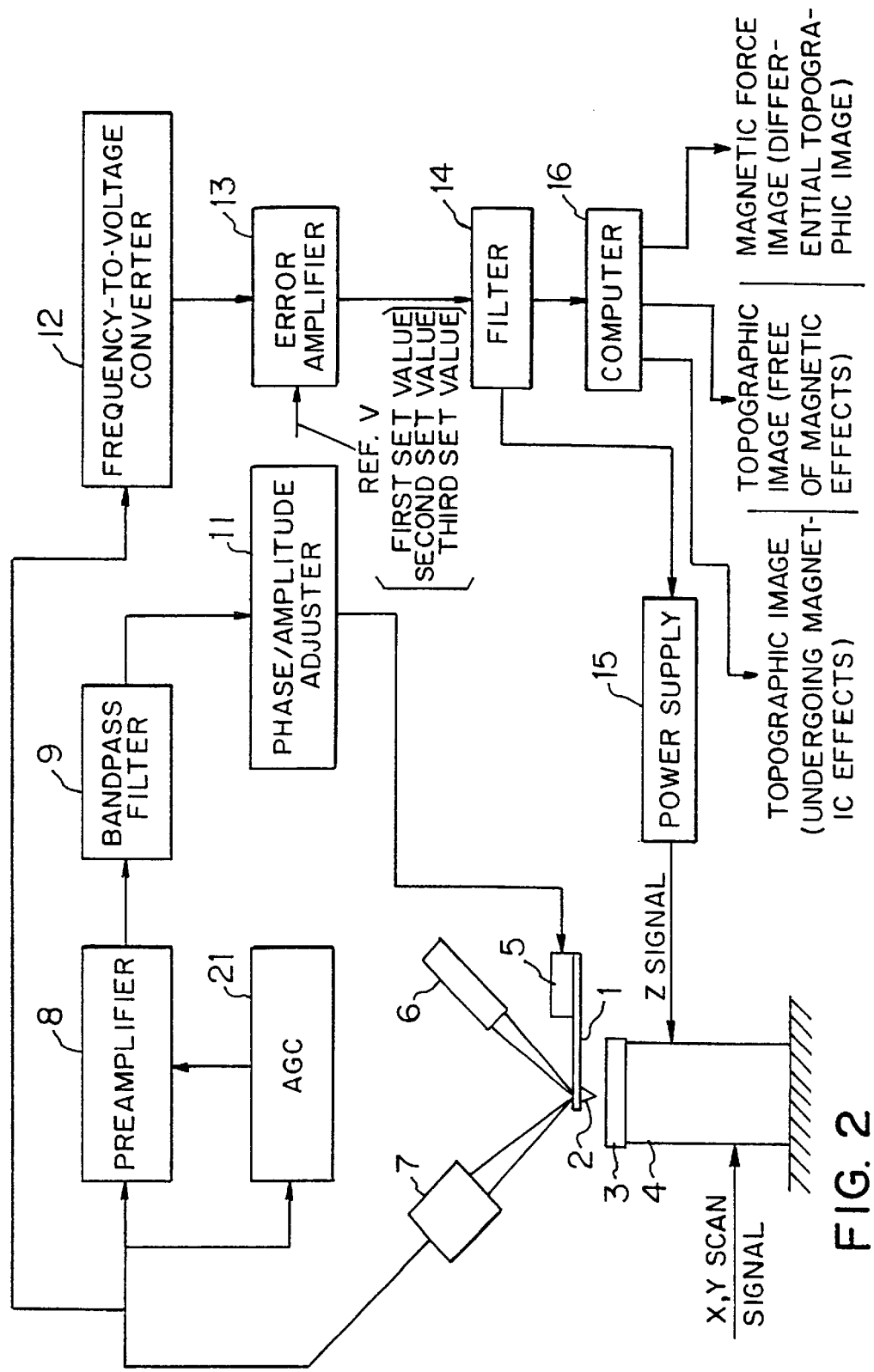
FIG. 2 is a schematic block diagram of another scanning probe microscope in accordance with the present invention.

Referring next to FIG. 2, there is shown another scanning probe microscope in accordance with the present invention. In the microscope described in connection with FIG. 1, both FM detection and slope detection are used. In the microscope shown in FIG. 2, only FM detection is used in detecting magnetic forces. This microscope shown in FIG. 2 is similar to the instrument shown in FIG. 1 except for the following points. The oscillator 17, the amplitude-to-dc voltage converter 18, and the first and second switches 19, 20 for slope detection are omitted from the instrument shown in FIG. 2. Furthermore, the waveform converter 10 is omitted, and the output from the bandpass filter 9 is directly applied to a phase adjuster 11' (described later). One of the oscillation systems includes an automatic gain control (AGC) 21 for adjusting the gain of the preamplifier 8 to maintain the amplitude of the cantilever 1 constant.

Because the amplitude of the cantilever 1 is adjusted by the AGC 21, the phase adjuster 11' is added instead of the phase/amplitude adjuster 11 of the instrument shown in FIG. 1. The output from the optical detector 7 is directly supplied to the frequency-to-voltage converter 12 to detect the oscillation frequency. Three reference values are established as the reference voltage V applied to the error amplifier 13. The first reference voltage is set for noncontact state of the tip 2 and the sample 3. The second and third reference values are set for close-proximity state of the tip 2 and the sample 3.

In this scanning probe microscope shown in FIG. 2, the oscillation system oscillates the cantilever 1 at its resonance frequency while maintaining the amplitude of the cantilever 1 constant in the same way as in the embodiment described above. The AGC 21 adjusts the gain of the preamplifier 8 such that the amplitude of the oscillating cantilever 1 is kept constant. The phase adjuster 11' adjusts the phase of the output from the bandpass filter 9 and sets the oscillating voltage to maximize the positive feedback provided by the oscillation system.

Figure 3:
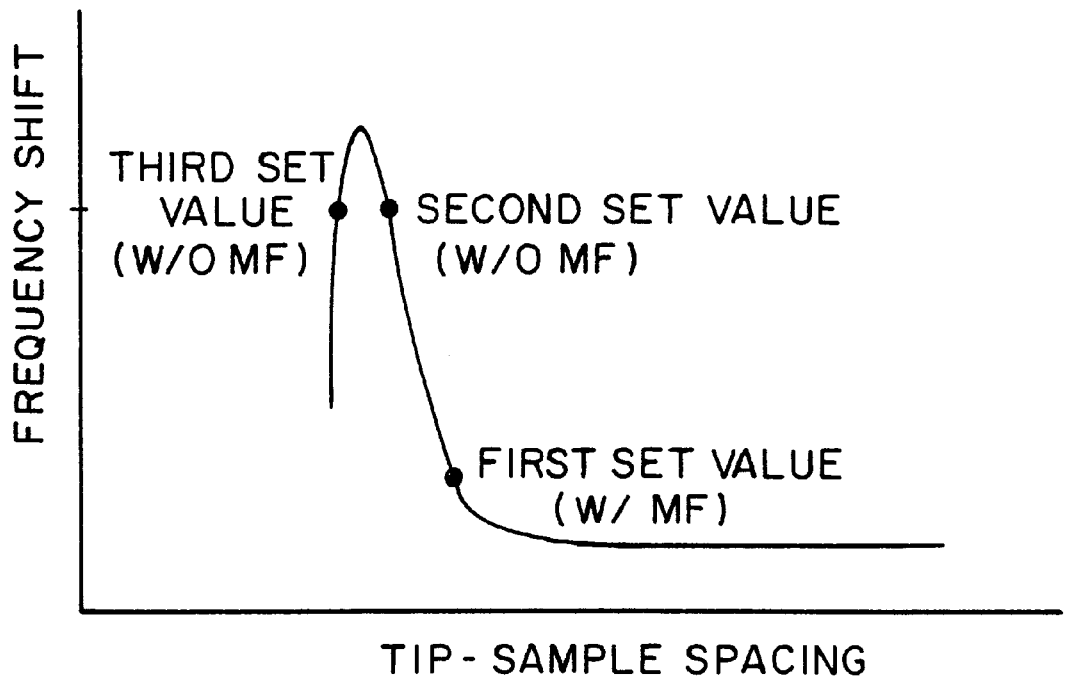
FIG. 3 is a graph showing the relation of the tip-sample separation in the microscope shown in FIG. 2 to frequency shift.

The frequency-to-voltage converter 12 converts a variation in the frequency into a corresponding voltage according to the output from the optical detector 7. The error amplifier 13 maintains constant the set given voltage, i.e., the deviation from the resonance frequency, according to the output voltage from the frequency-to-voltage converter 12 and the reference voltage V. The output from the error amplifier 13 is fed back to the piezoelectric scanner 4 that produces displacements in the z-direction. Where the tip 2 is not in contact with the sample 3, the first set value is used as the reference voltage V applied to the error amplifier 13. Where the tip 2 and the sample 3 are in close proximity, the second or third set value is used as the reference voltage V. In this scanning probe microscope, the frequency shifts relative to the tip-sample spacing as shown in FIG. 3, where the first set value is established for noncontact state. The second and third set values are established for positions where the tip 2 and the sample 3 are in contact with each other.

At the first set value, the tip and the sample are not in contact with each other. Therefore, a topographic image receiving magnetic effects is obtained. At the second and third set values, they are in close proximity and contact each other. In consequence, a topographic image free of magnetic effects is derived. At the third set value, the gradient of the curve representing the relation of the frequency to the tip-sample spacing is inverted and so it is necessary to invert the polarity of the signal fed back to the z piezoelectric element. A magnetic force image is obtained by taking the difference between the topographic image undergoing magnetic effects and the topographic image free of magnetic effects in the same way as in the embodiment described above.

As can be understood from the description provided thus far, a scanning probe microscope in accordance with one embodiment of the present invention produces a topographic image undergoing magnetic effects by FM detection that permits high resolution. Also, the instrument produces a topographic image almost free of magnetic effects by slope detection or contact-mode operation. A magnetic force image is created from the difference between these two topographic images. Consequently, a magnetic force image can be produced with higher resolution easily and reliably.

A scanning probe microscope in accordance with other embodiments of the invention produces a topographic image undergoing magnetic effects by FM detection that enables high-resolution imaging. Also, a topographic image almost free of magnetic effects is gained. A magnetic force image is produced from the difference between these two topographic images. Consequently, a magnetic force image can be created with higher resolution easily and reliably.

In a further embodiment of the invention, plural reference voltages are established. Therefore, a magnetic force image can be produced with higher resolution.

Having thus described my invention with the detail and particularity required by the Patent Laws, what is desired protected by Letters Patent is set forth in the following claims.

What is claimed is:

1. A method of producing a magnetic force image of a sample with a magnetic force sensitive tip on a cantilever having a resonance frequency, said sample being mounted for x, y and z axis positioning relative to said tip, said method comprising the steps of:

obtaining a first topographic image sensitive to magnetic force effects of a sample by detecting, during x and y scanning of the tip relative to the sample, the deviation from the resonance frequency of said cantilever in noncontact mode and adjusting the z axis position to maintain constant frequency;

obtaining a second topographic image free of magnetic force effects of said sample by detecting, during x and y scanning of the tip relative to the sample, the deviation from the amplitude of said cantilever and adjusting the z axis position to maintain constant amplitude; and producing the difference between the first and second topographic images, thus giving rise to a magnetic force image.

2. A scanning probe microscope fitted with a magnetic force sensitive tip on a cantilever having a resonance frequency, comprising:

a means for producing a first topographic image sensitive to magnetic force effects of a sample from the resonance frequency of said cantilever in noncontact mode and adjusting the z axis position to maintain constant frequency;

a first storage means for storing data about said first topographic image;

a means for producing a second topographic image free of magnetic force effects of said sample from the amplitude of said cantilever and adjusting the z axis position to maintain constant amplitude;

a second storage means for storing data about said second topographic image; and a means for producing the difference between the data about the first and second topographic images, respectively, stored in the first and second storage means, thus producing a magnetic force image.

3. A scanning probe microscope comprising:

a tip placed opposite to a sample to be investigated;

a cantilever for holding said tip;

an oscillating drive means for oscillating said cantilever;

a first oscillation voltage generation means for producing an oscillation voltage to oscillate said cantilever at or near its resonance frequency and to maintain oscillation of said cantilever;

a second oscillation voltage generation means for producing an oscillation voltage to oscillate said cantilever at or near its resonance frequency;

a first switching means for selectively connecting said first and second oscillation voltage generation means with said oscillating drive means;

a frequency-to-voltage converter for converting a change in oscillation frequency of said cantilever into a corresponding voltage;

an amplitude-to-voltage converter for converting a change in amplitude of said cantilever into a corresponding voltage;

an error amplifier for receiving first and second reference voltages, said error amplifier acting to produce a first output when the difference between an output from said frequency-to-voltage converter and said first reference voltage is kept constant, said error amplifier acting to produce a second output when the difference between an output from said amplitude-to-voltage converter and said second reference voltage is kept constant;

a second switching means for selectively connecting said frequency-to-voltage converter and said amplitude-to-voltage converter with said error amplifier;

a tip-sample spacing control means for maintaining constant the distance between said tip and said sample according to the outputs from said error amplifier;

an arithmetic means for taking the difference between said first and second outputs from said error amplifier;

means for producing a first topographic image undergoing magnetic effects of said sample from said first output from said error amplifier;

means for producing a second topographic image free of magnetic effects of said sample from said second output from said error amplifier; and means for producing a magnetic force image of said sample from the difference taken by said arithmetic means.

4. A scanning probe microscope comprising:

a tip placed opposite to a sample to be investigated;

a cantilever for holding said tip;

an oscillating drive means for oscillating said cantilever;

an oscillating voltage generation means for producing an oscillation voltage to oscillate said cantilever at constant amplitude;

a frequency-to-voltage converter for converting a change in oscillation frequency of said cantilever into a corresponding voltage;

an error amplifier for receiving a first reference voltage for noncontact imaging of said sample and a second reference voltage for contact imaging of said sample in close proximity to said tip, said error amplifier acting to produce a first output when the difference between an output from said frequency-to-voltage converter and said first reference voltage is kept constant, said error amplifier acting to produce a second output when the difference between an output from said frequency-to-voltage converter and said second reference voltage is kept constant;

a tip-sample spacing control means for maintaining the constant distance between said tip and said sample according to the outputs from said error amplifier;

an arithmetic means for taking the difference between said first and second outputs from said error amplifier;

means for producing a first topographic image undergoing magnetic effects of said sample from said first output from said error amplifier;

means for producing a second topographic image free of magnetic effects of said sample from said second output from said error amplifier; and means for producing a magnetic force image of said sample from the difference taken by said arithmetic means.

5. The scanning probe microscope of claim 4, wherein at least one of said first and second reference voltages can be switched between plural values.

* * * * *